United States Patent
Tsai et al.

(10) Patent No.: US 7,928,325 B2
(45) Date of Patent: Apr. 19, 2011

(54) ELECTROMAGNETIC SHIELD

(75) Inventors: Shu-Jen Tsai, Taipei Hsien (TW);
Long-Fong Chen, Taipei Hsien (TW);
Wen-Haw Tseng, Taipei Hsien (TW);
Shih-Fang Wong, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 209 days.

(21) Appl. No.: 12/343,368

(22) Filed: Dec. 23, 2008

(65) Prior Publication Data

US 2009/0166081 A1    Jul. 2, 2009

(30) Foreign Application Priority Data

Dec. 29, 2007    (CN) .......................... 2007 1 0203563

(51) Int. Cl.
*H05K 9/00*    (2006.01)

(52) U.S. Cl. .................. 174/382; 174/384; 361/816
(58) Field of Classification Search .................. 174/371, 174/382, 384, 388; 361/816, 818
See application file for complete search history.

(56) References Cited

U.S. PATENT DOCUMENTS

| | | | |
|---|---|---|---|
| 6,140,577 A * | 10/2000 | Rapaich et al. ............ 174/365 |
| 6,233,158 B1 * | 5/2001 | Leman .......................... 361/799 |
| 6,274,808 B1 * | 8/2001 | Cercioglu et al. ........... 174/371 |
| 6,359,216 B1 | 3/2002 | Liu | |
| 6,377,473 B1 | 4/2002 | Huang et al. | |
| 7,171,248 B1 | 1/2007 | Brown | |

* cited by examiner

*Primary Examiner* — Hung V Ngo
(74) *Attorney, Agent, or Firm* — Frank R. Niranjan

(57) ABSTRACT

An electromagnetic shield is for covering an electronic component on a printed circuit board. The electromagnetic shield includes a frame and a lid. The frame is welded onto the printed board and surrounds the electronic component. The frame defines a slot near the top of the frame. The lid passes through the slot and seals the top of the frame.

14 Claims, 3 Drawing Sheets

ELECTROMAGNETIC SHIELD

BACKGROUND

1. Field of the Invention

The present invention generally relates to an electromagnetic shield.

2. Description of Related Art

Electronic devices, such as computers, televisions, mobile phones, are widely used in our daily life. There are many electronic components on a motherboard in the electronic devices to cooperatively perform many functions. However, these electronic components are in close proximity to each other. As a result, electromagnetic (EM) waves generated from some components may interfere with the other ones, or may even be hazardous to the user. Therefore, EM waves shielding is important.

Operators often solder or weld a metallic shield to a printed circuit board (PCB) to shield one or more electronic components. The metallic shield has a good effect in blocking EM waves interfering with or radiating from the electronic component. However, operators need to detach the metal shield when inspecting the electronic component and afterwards must solder or weld the shield again. This is an inconvenience.

Therefore, an electromagnetic shield is needed in the industry to address the aforementioned deficiency.

SUMMARY

An electromagnetic shield covers an electronic component on a printed circuit board. The electromagnetic shield includes a frame and a lid. The frame is welded to the printed board and surrounds the electronic component. The frame defines a slot near the top of the frame. The lid passes through the slot and seals the top of the frame.

Other advantages and novel features of the present invention will become more apparent from the following detailed description of preferred embodiment when taken in conjunction with the accompanying drawings.

DETAILED DESCRIPTION

Figure 1:
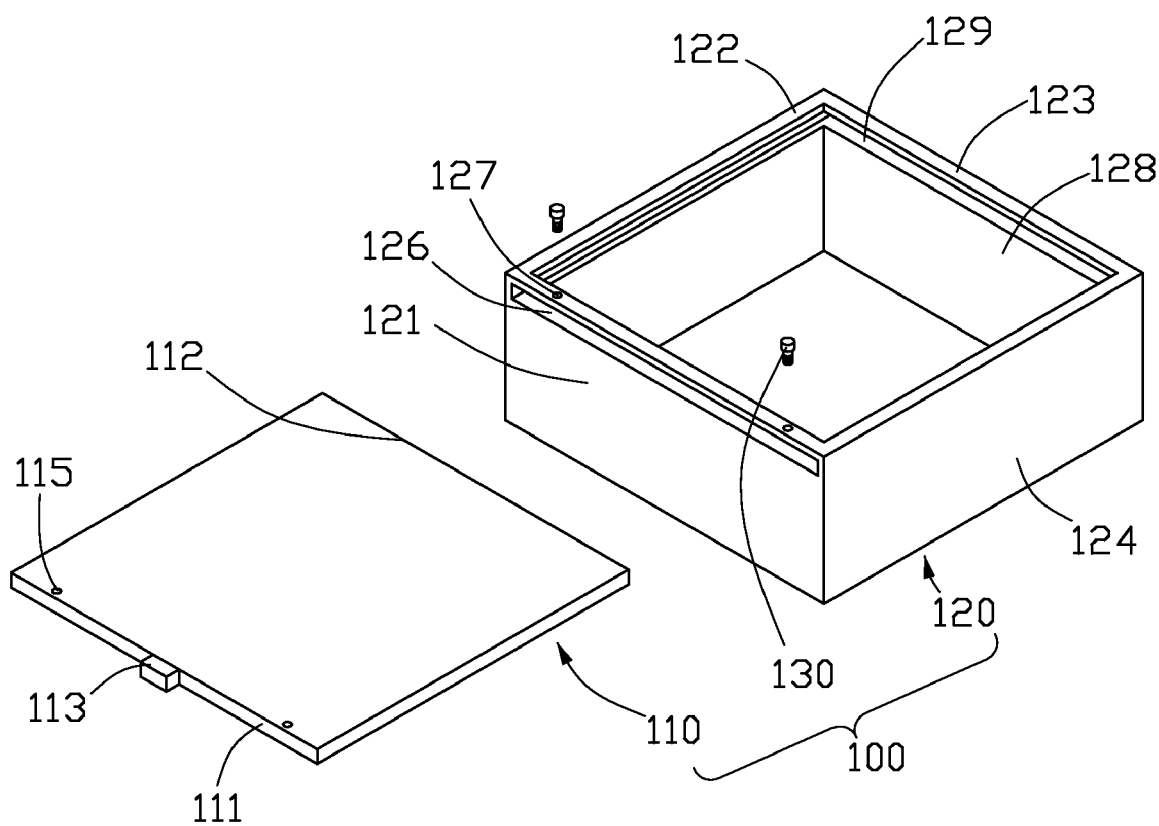
FIG. 1 is a schematic disassembled diagram showing an electromagnetic shield in accordance with an exemplary embodiment.
Figure 2:
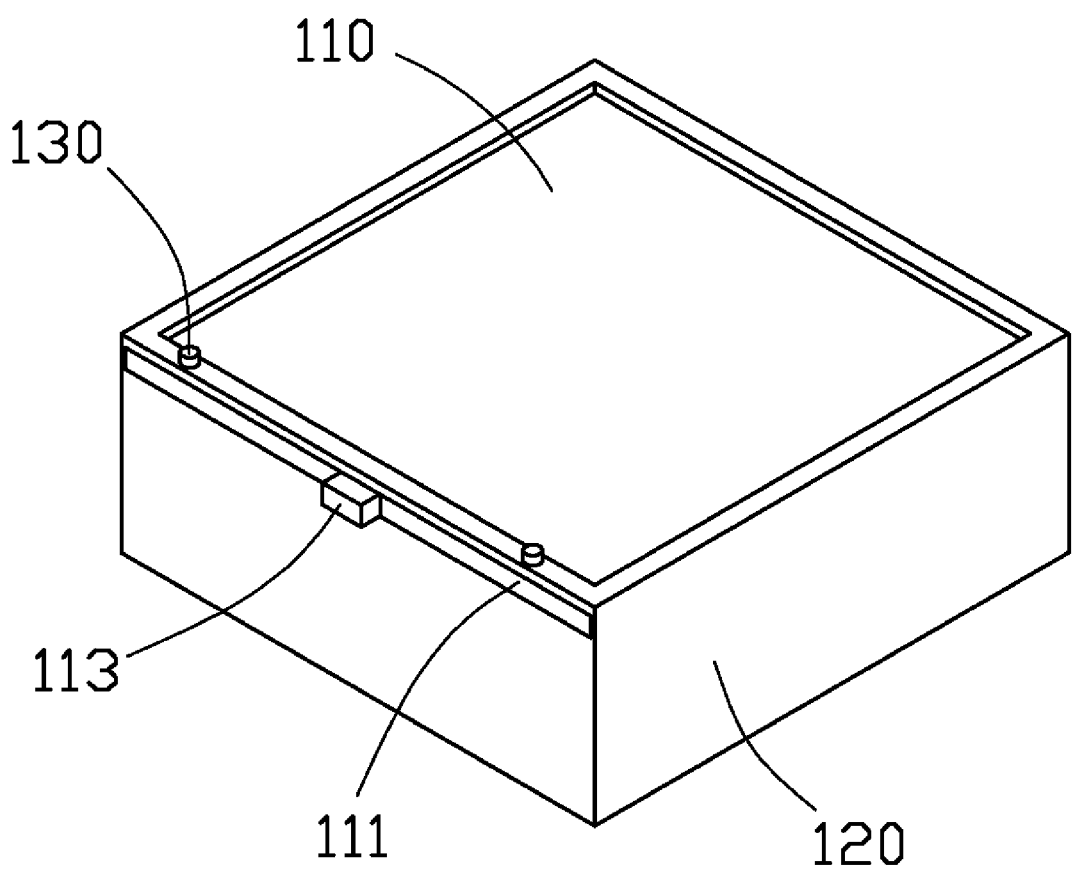
FIG. 2 is a schematic assembled diagram showing the electromagnetic shield of FIG. 1.
Figure 3:
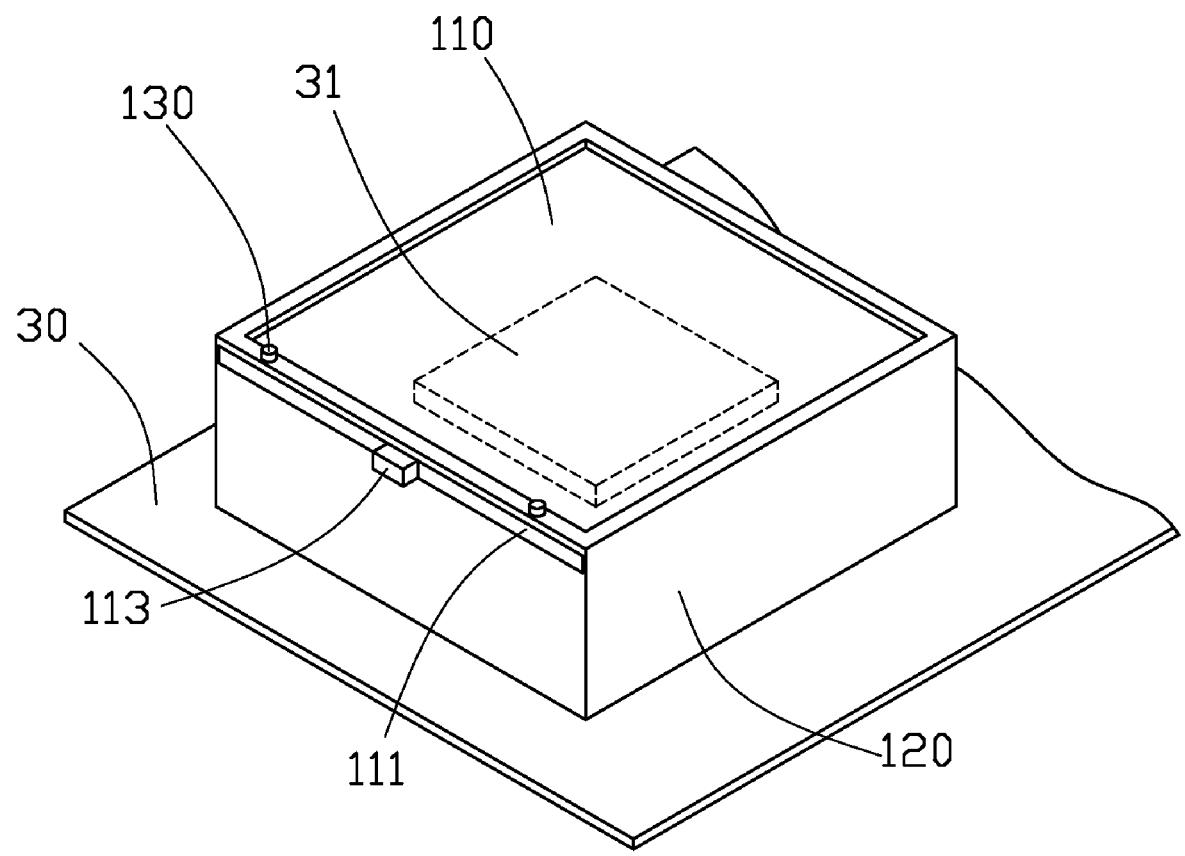
FIG. 3 is a schematic assembled diagram showing the electromagnetic shield covering an electronic component on a printed circuit board.

Referring to FIGS. 1, 2, and 3, an electromagnetic shield 100 in accordance with an exemplary embodiment is used to cover an electronic component 31 on a printed circuit board (PCB) 30. The electromagnetic shield 100 includes a frame 120, a lid 110, and two fasteners 130. The lid 110 is pulled through a slot 126 in one side of the frame 120 to seal the top of the frame 120, and the fasteners 130 fix the lid 110 on the frame 120. In this embodiment, the frame 120 and the lid 110 are made of metal, and the fasteners 130 are screws. In other embodiment, the frame 120 and the lid 110 may be made of conductive glass, and the fasteners 130 being wedges.

The lid 110 is a rectangular sheet. The lid 110 includes a first lateral surface 111 and a second lateral surface 112 opposite to the first lateral surface 111. A handle 113 protrudes from the first lateral surface 111. Two through holes 115 are defined in the lid 110 and near the first lateral surface 111. Each through hole 115 forms internal threadings (not shown).

The frame 120 is composed of a first side wall 121, a second side wall 122, a third side wall 123, and a fourth side wall 124. These four side walls 121, 122, 123, and 124 are successively connected to form an enclosure defining an opening 128. The slot 126 is defined in the first side wall 121 and near the top of the first side wall 121. Corresponding to the slot 126, three grooves 129 are defined on inner surfaces of the second side wall 122, the third side wall 123, and the fourth side wall 124 respectively. The slot 126 and the three grooves 129 cooperatively construct a restricted portion (not labeled). Two guiding holes 127 are defined in the top of the first side wall 121 corresponding to the two through holes 115 of the lid 110.

In assembly, the lid 110 is pushed into the frame 120 with the second lateral surface 112 of the lid 110 passing through the slot 126 first. The lid 110 slides along two opposite grooves 129 of the second side wall 122 and the fourth side wall 124. When the lid 110 is fully positioned it covers the opening 128 and the second lateral surface 112 of the lid 110 is embedded into the groove 129 of the third side wall 123. The fasteners 130 are passed through the guiding holes 127 and screwed into the through holes 115. Therefore, the top of the frame 120 is sealed by the lid 110.

In use, the electromagnetic shield 100 covers the electronic component 31 with the bottoms of the four side walls 121, 122, 123, and 124 welded to the PCB 30. When inspecting the electronic component 31, the fasteners 130 are first extracted from the two through holes 115 and the two guiding holes 127, and then the lid 110 is pulled out from the frame 120 through the slot 126. Therefore, it is not necessary to detach the electromagnetic shield 100 from the PCB 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electromagnetic shield for covering an electronic component on a printed circuit board, the electromagnetic shield comprising:

a frame for being welded onto the printed board and surrounding the electronic component, and the frame defining a slot near the top of the frame; and a lid passing through the slot and sealing the top of the frame;

wherein, the electromagnetic shield further comprises at least one fastener fixing the lid to the frame, and the frame comprises a first side wall, a second side wall, a third side wall, and a fourth wall successively connected to form an enclosure, the slot is defined in the first side wall, the second side wall, the third side wall, and the fourth side wall define three grooves respectively, the grooves and the slot cooperatively construct a restricted portion for receiving the lid, the first side wall defines at least one guiding hole in the top of the first side wall, and the guiding hole communicates with the slot.

2. The electromagnetic shield according to claim 1, wherein the lid defines at least one through hole.

3. The electromagnetic shield according to claim 2, wherein the fastener is passed through the guiding hole and screwed into the through hole.

4. The electromagnetic shield according to claim 1, wherein the lid is a rectangular sheet.

5. The electromagnetic shield according to claim 4, wherein the lid comprises a handle protruding from one lateral surface of the lid.

6. An electromagnetic shield for covering an electronic component on a printed circuit board, the electromagnetic shield comprising:

a frame for being welded onto the printed board and surrounding the electronic component, and the frame defining a slot and at least one guiding hole respectively on two adjacent surfaces of the frame, the slot communicating with the at least one guiding hole;

a lid passing through the slot and sealing the top of the frame; and at least one fastener screwing through the corresponding guiding hole to clamp the lid with the frame.

7. The electromagnetic shield according to claim 6, wherein the frame comprises a first side wall, a second side wall, a third side wall, and a fourth wall successively connected to form an enclosure.

8. The electromagnetic shield according to claim 7, wherein the slot is defined in the first side wall.

9. The electromagnetic shield according to claim 8, wherein the second side wall, the third side wall, and the fourth side wall define three grooves respectively.

10. The electromagnetic shield according to claim 9, wherein the grooves and the slot cooperatively construct a restricted portion for receiving the lid.

11. The electromagnetic shield according to claim 10, wherein the lid defines at least one through hole.

12. The electromagnetic shield according to claim 10, wherein the fastener further screws into the through hole.

13. The electromagnetic shield according to claim 12, wherein the lid is a rectangular sheet.

14. The electromagnetic shield according to claim 13, wherein the lid comprises a handle protruding from one lateral surface of the lid.

* * * * *